Jan. 6, 1953 D. L. ARENBERG 2,624,804

SOLID DELAY LINE

Filed April 2, 1946 2 SHEETS—SHEET 1

INVENTOR
DAVID L. ARENBERG
BY
William D. Hall
ATTORNEY

Jan. 6, 1953 D. L. ARENBERG 2,624,804

SOLID DELAY LINE

Filed April 2, 1946 2 SHEETS—SHEET 2

INVENTOR
DAVID L. ARENBERG
BY
William D. Hall
ATTORNEY

Patented Jan. 6, 1953 2,624,804

UNITED STATES PATENT OFFICE 2,624,804

SOLID DELAY LINE

David L. Arenberg, Rochester, Mass., assignor, by mesne assignments, to the United States of America as represented by the Secretary of War Application April 2, 1946, Serial No. 659,110

20 Claims. (Cl. 178—44)

This invention relates to delay means and more particularly to supersonic delay lines.

In many radio and electronic applications, it is desirable to delay a signal for a time that may be in the order of several microseconds or several milliseconds. For very short delay times, that is of the order of a very few microseconds, electronic delay lines composed of inductors and capacitors are often employed; however, when delays of several microseconds are required the difficulty in construction of a suitable electronic delay line makes it advisable to employ other means for delaying the signal. The so-called "supersonic delay line" is often employed in instances where the delay required is greater than the delay that can be conveniently obtained by means of an electronic delay line. In the supersonic delay line a pulse of supersonic energy usually of a frequency of 10 to 30 megacycles is introduced at a selected point in a solid or liquid transmission medium and at a second point a predetermined distance from the first point this energy is detected to provide an output signal from the delay line. The time delay of such a supersonic delay line is the time required for the supersonic energy to travel the distance between the above mentioned two points. This time may be accurately calculated from the properties of the transmission medium and the length of the path traveled by the supersonic energy.

The usual structure of a delay line employing a solid medium is to form the energy transmission medium into a bar or rod, and cement or otherwise attach to one end of the bar a piezoelectric crystal designed to oscillate at a frequency of 10 to 30 megacycles or some other convenient frequency. An electronic signal from a line driver circuit is applied to this crystal to cause it to oscillate. The signal from the line driver circuit may be in various forms, the most convenient of which is a carrier frequency between 10 and 30 megacycles amplitude modulated with the signal to be delayed. At the other end of the bar or rod of transmission material a second piezoelectric crystal is cemented or otherwise attached and this crystal on being stressed by the supersonic energy traveling down the rod produces an electrical signal that is substantially identical to the signal applied to the first or transmitting crystal. The signal from the second or receiving crystal is usually connected to a receiving or demodulating circuit which removes the carrier supplied by the line driver circuit and provides as an output therefrom a signal corresponding to the original undelayed signal. This output signal from the demodulating circuit will occur at a time after the signal applied to the driver circuit equal to the time delay suffered by the supersonic energy traveling the length of the transmission medium. The time delay that may be obtained with this type of transmission line is obviously limited by the type of material available and the physical length of the line that may be employed.

In order to reduce the physical length of a delay line a liquid type delay line has been employed in which the transmitting and receiving crystals are immersed in a suitable transmitting liquid such as mercury. Reflectors of metal or other suitable material are also immersed in the liquid and supersonic energy from the transmitting crystal is caused to rebound from one or more of these reflectors before reaching the receiving crystal. This results in a delay that is longer than the delay that could be obtained had the energy traveled directly from the transmitting crystal to the receiving crystal, due to the bent or folded nature of the path in this instance. The disadvantages of this type of delay line are that since a liquid transmission medium is employed care must be taken to avoid tipping the delay line and thus causing the liquid to overflow the container in which it is confined or else a sealed container must be provided. A second disadvantage of this type of delay line is that the position of the transmitting and receiving crystals and the reflectors must be accurately adjusted so that the energy travels along a certain path. It may be difficult in many instances to obtain the proper adjustment of these reflectors and in other instances it may be difficult to maintain this adjustment under severe operating condition. Other disadvantages are also encountered which make liquid delay lines undesirable for mobile, for example, airborne work.

It is an object of this invention therefore to provide a novel type delay line employing a solid transmission medium in which the supersonic energy is multiply reflected in traveling between the transmitting crystal and the receiving crystal.

A further object of this invention is to provide a solid delay line of relatively small size in which the energy is multiply reflected in a plane in traveling from the transmitting crystal to the receiving crystal thereby providing a relatively long delay of signals passing therethrough.

A still further object of this invention is to provide a supersonic delay line employing a solid transmitting means in which the beam of supersonic energy is multiply reflected in three dimensions in traveling from the transmitting crystal to the receiving crystal.

For a better understanding of the invention together with other and further objects thereof reference is had to the following description taken in connection wtih the accompanying drawings in which.

Figure 1:
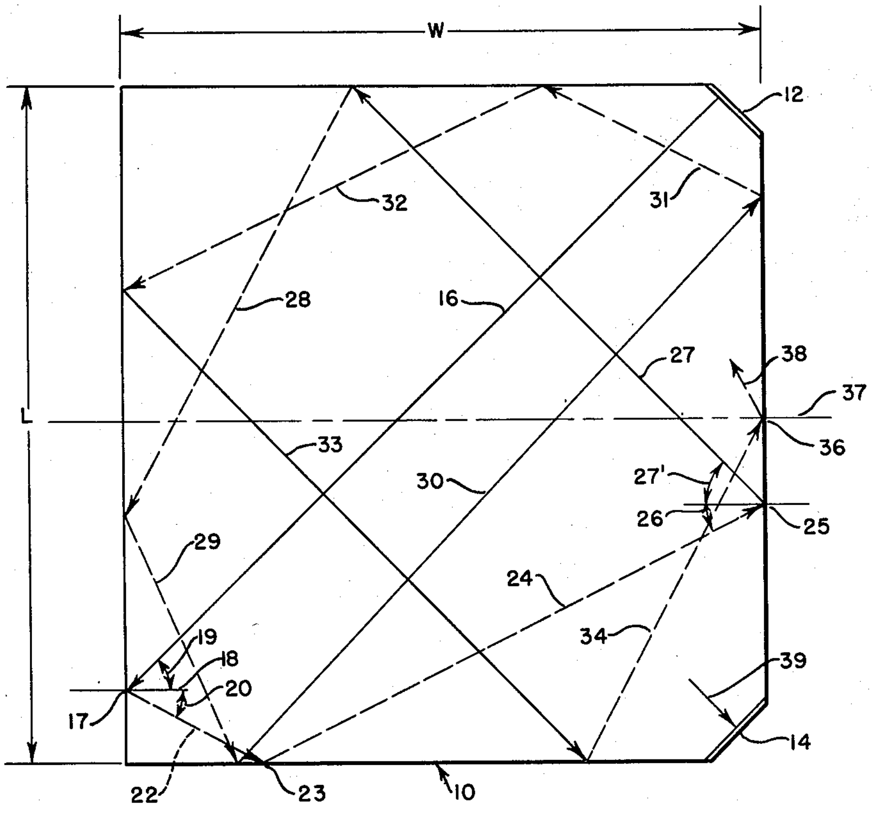
Fig. 1 is a plan view of a type of supersonic delay line in which the beam of supersonic energy is multiply reflected in a plane.

In Fig. 1 of the drawings there is shown a block of solid material 10 that is approximately rectangular in shape. Two adjacent corners of the rectangle have been removed forming a surface at an angle of 45° with either side to provide seats for a transmitting piezoelectric crystal 12 and a receiving piezoelectric crystal 14. The delay line shown in Fig. 1 is s o constructed that 22 specular reflections of the beam of supersonic energy take place between the transmitting crystal 12 and receiving crystal 14. For purposes of illustration the size of the delay line shown in Fig. 1 will be described in detail so that the principle of the operation of the invention may be more fully understood. It is not intended, however, that the invention be limited to the particular size and configuration or number of reflections of the delay line shown in Fig. 1; rather it is intended that this invention include all similar delay lines that employ the principles of the invention as set forth herein and as defined by the appended claims.

To obtain minimum spreading of the beam of energy as it travels through the transmission medium it is desirable to have the energy travel in the transverse mode because of the shorter wavelength of this mode as compared to the wavelength of the compressional mode. The transverse mode is also advantageous in that the lower velocity of propagation of this mode also provides a longer time delay for the same physical length of path than would be obtained if the compressional mode was employed throughout the complete length of the path. The transverse mode of propagation is employed for a large fraction of the path in the delay line of Fig. 1 and for almost the complete path in the delay lines shown in Figs. 2 and 3.

The size of the delay line shown in Fig. 1 is such that the width W is equal to the length L divided by the factor 1.04; however, in other embodiments of the invention this factor may be other than the one herein employed. The thickness of this delay line may be any convenient value since the beam of supersonic energy travels only in a plane. The material from which the delay line shown in Fig. 1 is constructed should have a Poisson's ratio of 0.16. For materials having this Poisson's ratio the conversion of the supersonic energy from the compressional mode of propagation to the transverse mode of propagation will occur when the energy strikes the boundary of the transmission medium at an angle of approximately 45° with the normal, the total conversion angle. Conversion from the transverse mode to the compressional mode will occur when the beam strikes the boundary of the transmission medium at an angle of approximately 27° with the normal. This latter angle is hereinafter designated as the supplementary conversion angle.

Energy from crystal 12 traveling in the compressional mode along the line 16 will strike the boundary of the transmission medium at a point 17 at an angle of approximately 45° with the normal where the normal is represented by line 18 and the angle with the normal is represented by the angle 19. In reading the following description of the embodiment of the invention shown in Fig. 1 it should be noted that energy traveling in the compressional mode always travels in paths making an angle of 45° with the sides of the transmission medium. It should also be noted that total conversion of energy from one mode of propagation to the other occurs at either end of these paths. The beam will rebound from point 17 at an angle to the normal that is represented by the angle 20. The energy rebounding from point 17 will be propagated in a transverse mode due to the fact that angle 19 is equal to the so-called total conversion angle for the type of material employed. Angle 20 will be smaller than angle 19 due to the slower speed of the supersonic energy while traveling in the transverse mode as compared to the speed of transmission of energy in the compressional mode. The energy rebounding from point 17 will travel along path 22 and again strike the boundary of the transmission medium 10 at a point 23 where it again rebounds along a path 24. Energy in path 24 is still propagated in the transverse mode because the angle at which the energy in path 22 strikes the boundary of transmission medium 10 is greater than the critical angle for the transverse mode so that total reflection of the energy occurs without a change in mode of propagation. The beam traveling along path 24 strikes the boundary of transmission medium 10 at a point 25 and at an angle 26 with the normal. In this case angle 26 is approximately 27° or equal to the supplementary conversion angle so that the beam rebounds from point 25 along a path 27 in the compressional mode. The path 27 makes an angle 27′ with the normal where angle 27′ is greater than angle 26 due to the increase in velocity of the beam as it changes from the transverse to the compressional mode. This process of multiple reflection of the beam is continued so that energy travels along the paths 28 to 34 inclusive. In Fig. 1 paths shown by solid lines, for example paths 16 and 30, indicate that the energy travels in the compressional mode along these paths, while paths represented by dotted lines, for example paths 22 and 24, indicate that the energy travels in the transverse mode along these paths. Energy traveling in the transverse mode along the path 34 strikes the boundary of transmission medium 10 at a point 36. Point 36 lies on line 37 which is a line of symmetry of the delay line. For reasons of clarity only the paths up to point 36 have been shown. The remainder of the paths from point 36 to crystal 14 may be obtained by reflection of the existing paths about the line of symmetry 37. For example, path 38 will be the reflection of path 34 about the line 37. The path along which the supersonic energy travels as it finally arrives at crystal 14 is represented by path 39. Path 39 will be the reflection of path 16 about line 37. For those not familiar with geometry these paths not shown may be visualized by placing a mirror perpendicular to the plane of the drawing with its silvered surface along the line 37. The paths shown in the mirror will then indicate those portions of the paths not shown lying to one side of line 37. By reversing the mirror paths on the other side of line 37 may be visualized. The invention is not limited to the path pattern herein shown, since many variations of these symmetrical patterns are available. Unsymmetrical path patterns may also be employed but they are believed to be less efficient than the symmetrical patterns.

The part of this invention illustrated by the delay line shown in Fig. 1 includes a multiple reflection of a supersonic beam of energy within a substantially plane sheet of material so that a time delay is obtained that is much greater than the delay that could be obtained from the same physical size of material had the beam of energy been directed immediately from the transmitting crystal to the receiving crystal. Delay lines similar to that shown in Fig. 1 may be constructed by determining the angle of conversion between the transverse and compressional modes and between the compressional and transverse modes and then plotting the path of the energy as it travels from the transmitting crystal to the receiving crystal. One principle involved in constructing this type of delay line is that if the delay line is symmetrical about a line and if energy traveling along any path strikes the boundary of the transmission line at a point on this line of symmetry and rebounds at an angle equal to the angle of incidence, the paths traced from this point on will be the mirror image of the paths already traced, this image being taken about the line of symmetry.

Figure 2:
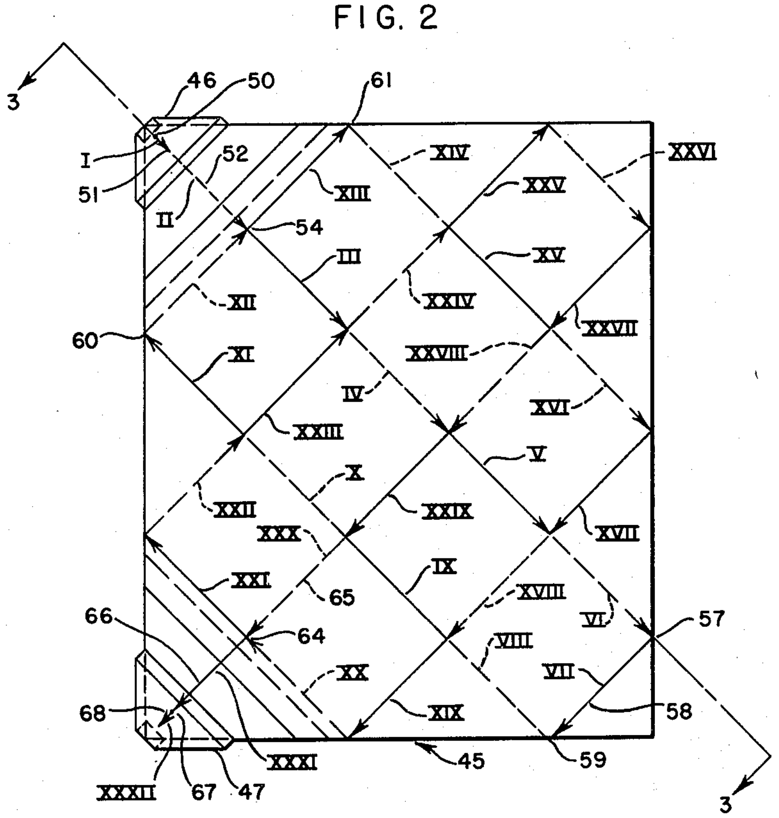
Fig. 2 is a plan view of a supersonic delay line in which the beam of supersonic energy is reflected in three dimensions in traveling from the transmitting crystal to the receiving crystal.
Figure 3:
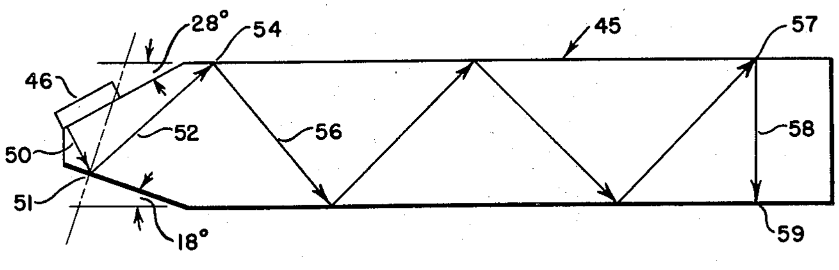
Fig. 3 is a cross section of the delay line shown in Fig. 2 taken along the line 3—3 in Fig. 2.

In Figs. 2 and 3 of the drawings there is illustrated a solid delay line in which the beam of supersonic is reflected in three dimensions in traveling from the transmitting crystal to the receiving crystal. The delay line shown in these figures comprises a substantially rectangular block 45 of a transmitting medium having a Poisson's ratio less than 0.28. Two planes are passed through the solid block at adjacent corners of the top surface so that each plane intersects the top surface in a line that make angles of 45° with the sides of the block and the planes make an angle of 28° with the top surface of the block. The material above each plane is removed to form seats for transmitting crystal 46 and receiving crystal 47. At the same corners of the solid, planes making an angle of 18° with the bottom surface of the solid are passed so that the lines of intersection of the planes with the bottom surface of the solid make angles of 45° with the sides of the solid. The material below these planes is removed for reasons to be described shortly. The above mentioned angles of 28° and 18° respectively are computed for material having a Poisson's ratio of 0.16. If material having a Poisson's ratio different than the one herein shown is used for the transmission medium, the proper angles for the new medium should be substituted for the angles herein shown. Fig. 3 illustrates the cross-sectional shape of the solid at the corner of the solid where transmitting crystal 46 is located. The corner of the solid at which crystal 47 is located will have a shape identical to that shown in Fig. 3. The size of the delay line shown in Figs. 2 and 3 is so selected that the rectangular configuration of the energy paths shown in these figures will be produced by the beam of the supersonic energy in traveling from crystal 46 and crystal 47. The invention is not limited to the path configuration shown in Figs. 2 and 3; rather these figures serve to illustrate one embodiment of the invention. Energy from crystal 46 travels in the compressional mode along a path 50 until it strikes the boundary of transmission medium 45 at a point 51. Energy along path 50 is traveling in a compressional mode and strikes the boundary of transmission medium 45 at an angle that is equal to the total conversion angle as defined above. The energy will therefore rebound specularly from point 51 along the path 52 and will travel along this path 52 in the transverse mode. Path 52 makes a smaller angle with the normal at point 51 then does path 50 for the reason given above.

The angle with the normal mode by the incident and reflected paths are exactly defined by Snell's law; that is $$\frac{\sin \alpha}{\sin \beta}=\frac{V_I}{V_R}$$

where $\alpha$ is the angle of incidence, $\beta$ is the angle of reflection, $X_I$ is the velocity of the incident wave and $V_R$ is the velocity of the reflected wave.

Energy traveling along path 52 strikes the boundary of transmission medium 45 at a point 54 at an angle of 45° with the normal, and rebounds, still in the transverse mode, along the path 56 which also makes an angle of 45° with the normal.

No change in mode of propagation takes place at point 54 because the incident path at this point makes an angle with the normal that is greater than the critical angle for the transverse mode of propagation.

Energy will continue to rebound alternately from the top and bottom surfaces of the solid until it reaches point 57 on block 45. At point 57 the path is changed in two directions. It is deflected 45° downward toward the bottom surface of the solid 45 and in a plane that is at right angles to the plane of the paths from point 51 to point 57. The path of rebound from point 57 is denoted as path 58 in Figs. 2 and 3. Energy traveling along the path 58 again strikes the boundary solid 45 at a point 59. At point 59 the energy is reflected upward at an angle of 45° and in a plane that is parallel to the plane of the path containing the paths from point 51 to point 57. From point 59 the energy alternately rebounds from the top and the bottom surfaces of solid 45 until the boundary of the solid is reached at point 60. Again the plane of the paths is changed by 90° and the energy eventually arrives at point 61. This process is continued until the energy reaches a point 64 on the top surface of solid 45. Energy arrives at point 64 along the path 65 and rebounds from point 64 along the path 66. Energy traveling along the path 66 strikes the lower inclined surface of solid 45 at a point 67. Energy is reflected from point 67 upward along a path 68. The angle between paths 66 and the normal to the surface at point 67 is equal to the supplementary conversion angle so that energy traveling along the path 68 is again in the compressional mode. Path 68 is normal to the upper inclined surface of solid 45 on which crystal 47 is located and, therefore, the energy in the supersonic beam leaves transmission medium 45 and causes mechanical stresses in crystal 47. These mechanical stresses produce an electrical signal which may be taken from crystal 57 by means of suitable connections (not shown) to the opposite faces thereof. As an aid in following the path of the supersonic beam as it travels from crystal 46 to crystal 47 paths indicating travel of the beam from the top surface to the lower surface of block 45 are shown as solid lines, while paths indicating travel of the beam from the lower surface to the upper surface of solid 45 are shown as dotted lines. Energy travels entirely in the transverse mode except for the two paths 50 and 68. As a further aid in following the path of the signal through the transmission medium the paths beginning with path 50 and ending with path 68 are given consecutive Roman numerals starting with Roman numeral I for path 50.

To construct a delay line similar to that of Fig. 2 the following principles should be kept in mind:

(1) Energy leaves the transmitting crystal along a path that is normal to the surface to which the crystal is mounted.

(2) Energy traveling in the compressional mode striking a surface at an angle to the normal equal to the total conversion angle will rebound from that surface in a transverse mode.

(3) Energy striking a surface in a transverse mode along a path making an angle with normal equal to the supplementary conversion angle will rebound from that surface in the compressional mode.

(4) Energy traveling in a compressional mode striking a surface at an angle with the normal not equal to total conversion angle and not along the line of the normal will rebound in the same mode with an angle of reflection equal to the angle of incidence.

(5) Energy traveling in the transverse mode striking a surface at an angle to the normal not equal to the supplementary conversion angle and not along the normal to the surface will rebound from that surface in the transverse mode with an angle of reflection equal to the angle of incidence.

(6) Energy striking a boundary surface of the transmission medium will be reflected from that surface in a plane defined by the normal to that surface and the path of incidence.

(7) The relationship between the incident energy path and the reflected energy paths and the normal to the surface is defined by Snell's law that is:

$$\frac{\sin \alpha}{\sin \beta}=\frac{V_I}{V_R}$$

where $\alpha$ is the angle between the incident energy path and the normal, $\beta$ is the angle between the normal and the reflected energy path, $V_I$ is the velocity of the incident wave and $V_R$ is the velocity of the reflected wave.

(8) It is believed that the best results will be obtained if the transmission medium is proportional in accordance with the following ratio: $L:w:h=n:(n-1):1$ where L, $w$ and $h$ are the length, width and height respectively of the transmission medium and $n$ is any convenient integer.

By employing these principles and the fundamental precepts of geometry a delay line of any desired physical size and any desired time delay may be constructed.

The advantages of delay lines shown in Figs. 1, 2 and 3 of the drawings should be apparent to those skilled in the art. The transmission medium employed is a solid and therefore needs no container and may be oriented in any position. The transmitting and receiving crystals may be cemented, soldered or otherwise rigidly fastened to the transmission medium; therefore, there is no adjustment that may be damaged by shocks encountered by the delay line. These delay lines also provide a much greater time delay for the same physical size than do delay lines heretofore used. The delay line shown in Figs. 2 and 3 has the further advantage over the delay line shown in Fig. 1 and those hereto used in that the energy travels in three dimensions allowing a still greater reduction in size for the same time delay. The energy travels almost entirely in the transverse mode which again provides a longer time delay, minimizes the chance of ghost or multiple received signals due to the incomplete conversion of the energy from the transverse to the compressional mode or the compressible mode to the transverse mode and also minimizes the spreading of the beam of energy.

The delay line of Figs. 2 and 3 may also be used with crystals mounted rigidly on the solid and vibrating with purely transverse motion. This would eliminate the restriction that the material must have a Poisson's ratio less than .28. If such a crystal is employed it should be so mounted that the initial path strikes the boundary of the delay medium at the proper angle.

Although not shown in the application means for reducing signals due to beam spreading, normal reflection of the energy waves and so forth may be incorporated when necessary.

As has been previously stated the invention is not limited to the particular delay lines shown in the drawing but rather includes all delay lines employing the principles herein described within the limits set forth in the appended claims, therefore, while there has been described what are at present considered to be the preferred embodiments of this invention, it will be obvious to those skilled in the art that various changes and modifications may be made therein without departing from the scope of the invention.

What is claimed is:

1. A delay line comprising a solid block of transmission material having a given mode conversion angle for conversion of supersonic energy from a first mode to a second mode, means mounted upon said block for inducing supersonic energy therein at said first mode of propagation, said means being so mounted that the angle of incidence of said energy with one of the boundaries of said block is substantially equal to said conversion angle thereby causing said energy to be translated into said second mode, said energy then being multiply reflected from the boundaries of said block, and means mounted upon said block for receiving said reflected and delayed energy.

2. The delay line of claim 1, wherein said block consists of a material having a Poisson ratio of less than 0.28.

3. The delay line of claim 2, wherein said means respectively comprise crystal transducers.

4. The delay line of claim 1, wherein said inducing means is so mounted that said energy while in said second mode strikes a boundary of said block at an angle which causes it to arrive at said receiving means in said first mode.

5. The delay line of claim 4, wherein said inducing means is so mounted that said energy while being multiply reflected is translated from said second mode to said first mode and back again a plurality of times before its arrival at said receiving means.

6. The delay line of claim 1, wherein said inducing means is so mounted that said energy while in said second mode is first multiply reflected and then strikes a boundary of said block at an angle which causes it to arrive at said receiving means in said first mode.

7. A delay line comprising a solid block of transmission material having a Poisson ratio of less than 0.28 and given total and supplementary conversion angles for conversion and reconversion of supersonic energy between compressional and transverse modes respectively, first means for inducing energy in the compressional mode into said block, said means being so mounted upon said block that said energy strikes a boundary of said block at an angle of incidence substantially equal to said total conversion angle, is translated into the transverse mode in order to decrease the velocity of propagation, and then multiply reflected from the boundaries of said block, and second means mounted upon said block for receiving said energy after it has been delayed.

8. The delay line of claim 7, wherein said first means is so mounted that said energy while in the transverse mode will strike a boundary of said block at an angle of incidence substantially equal to said supplementary conversion angle and be translated into the compressional mode before being received by said second means.

9. The delay line of claim 8, wherein said first means is so mounted that said energy is translated from the compressional to the transverse mode and back again a plurality of times before being received by said second means.

10. A solid delay line, comprising a block of transmission material, transmitting means for applying supersonic signals to said block, and receiving means for receiving said signals from said block, said block being so formed and both said means being so mounted thereon that energy from said transmitting means is specularly reflected from and between two boundaries of said block at angles lying in a given plane, until a third boundary of said block is reached by said reflected energy, whereupon said energy is caused to be reflected at angles lying in another plane, said energy being thus reflected at angles lying in a plurality of planes until said receiving means is reached.

11. The delay line of claim 10, wherein said block of transmission material has a Poisson ratio of less than 0.28.

12. The delay line of claim 11, wherein said material is fused quartz having a Poisson ratio of 0.16.

13. The delay line of claim 12, wherein said block is rectangular and the length, width and height of said block have the proportions $$n:(n-1):1$$

where $n$ is an integer.

14. A delay line comprising a solid, rectangular block of transmission material having a Poisson ratio of 0.16, a total conversion angle of approximately 45°, and a supplementary conversion angle of approximately 27°, first and second piezoelectric crystal means for respectively transmitting and receiving energy in the compressional mode, each of said crystal means being respectively mounted upon first and second adjacent corners of said block, each of said corners being bounded by a first plane making an angle of about 45° with the sides and an angle of about 28° with the top of said block, and also being bounded by a second plane making an angle of about 45° with the sides and an angle approximately equal to 18° with the bottom of said block, said compressional energy being transmitted and received at right angles to the surface of said crystal means, each of said crystal means being respectively mounted on said corners upon said first plane, the compressional energy propagated by said first crystal means striking said second plane at said first corner at an angle of incidence substantially equal to 45°, being translated into the transverse mode in order to decrease the velocity of propagation, being multiply reflected from the boundaries of said block, and then striking said second plane at said second corner at an incidence angle of approximately 27°, being translated back into the compressional mode and received by said second crystal means.

15. The delay line of claim 14, wherein the length, width, and height of said block have the proportions $n:(n-1):1$, where $n$ is an integer.

16. A delay line comprising a solid rectangular block of transmission material having a Poisson ratio of 0.16, a total conversion angle of approximately 45°, and a supplementary conversion angle of approximately 27°, first means for inducing energy in the compressional mode into said block, said means being mounted upon a corner of said block at an angle of 45° with the sides thereof in order that said energy may strike a boundary of said block at an angle of incidence substantially equal to 45°, be translated into the transverse mode in order to decrease the velocity of propagation, and then be multiply reflected from the boundaries of said block at angles lying in a given plane, and second means mounted upon another corner of said block at an angle of 45° with the sides thereof in order to receive said energy after it has been delayed.

17. The delay line of claim 16, wherein said first means is so mounted that said energy while in the transverse mode will strike a boundary of said block at an angle of incidence substantially equal to 27° and be translated into the compressional mode before being received by said second means.

18. The delay line of claim 17, wherein said first means is so mounted that said energy is translated from the compressional to the transverse mode and back again a plurality of times before being received by said second means.

19. The delay line of claim 18, wherein the length of said block is equal to 1.04 times the width thereof, the reflected energy paths being symmetrical about a line running the width of said block and bisecting the length thereof.

20. The delay line of claim 19, wherein the material of said block is fused quartz.

DAVID L. ARENBERG.

REFERENCES CITED

The following references are of record in the file of this patent:

UNITED STATES PATENTS

| Number | Name | Date |
|---|---|---|
| 2,263,902 | Percival | Nov. 25, 1941 |
| 2,401,094 | Nicholson | May 28, 1946 |